(12) United States Patent
Kawashima

(10) Patent No.: US 7,400,275 B2
(45) Date of Patent: Jul. 15, 2008

(54) ENCODING/DECODING DEVICE FOR COMPRESSING OR EXPANDING DIGITAL DATA

(75) Inventor: Ichiro Kawashima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 10/586,611

(22) PCT Filed: Oct. 4, 2004

(86) PCT No.: PCT/JP2004/014985

§ 371 (c)(1),
(2), (4) Date: Jul. 19, 2006

(87) PCT Pub. No.: WO2005/076481

PCT Pub. Date: Aug. 18, 2005

(65) Prior Publication Data
US 2007/0152851 A1 Jul. 5, 2007

(30) Foreign Application Priority Data
Feb. 10, 2004 (JP) ............................. 2004-032946

(51) Int. Cl.
*H03M 5/00* (2006.01)

(52) U.S. Cl. .......................................... 341/55; 341/50

(58) Field of Classification Search .............. 341/50–90
See application file for complete search history.

(56) References Cited

U.S. PATENT DOCUMENTS

| 6,201,488 B1 | 3/2001 | Sato et al. |
| 6,292,847 B1 | 9/2001 | Nishimoto et al. |
| 6,480,537 B1 * | 11/2002 | Agrawal et al. .............. 375/240 |
| 6,570,926 B1 * | 5/2003 | Agrawal et al. ........ 375/240.27 |
| 6,794,995 B2 | 9/2004 | Shimada |
| 2002/0154900 A1 | 10/2002 | Shimada |

FOREIGN PATENT DOCUMENTS

| JP | 5-110448 A | 4/1993 |
| JP | 11-167400 A | 6/1999 |
| JP | 2001-202094 A | 7/2001 |
| JP | 2001-297006 A | 10/2001 |
| JP | 2002-62898 A | 2/2002 |
| JP | 2002-116913 A | 4/2002 |
| JP | 2002-318598 A | 10/2002 |

* cited by examiner

*Primary Examiner*—Lam T Mai
(74) *Attorney, Agent, or Firm*—McDermott Will & Emery LLP

(57) ABSTRACT

A general-purpose processor expands and transmits to a volatile memory compressed program data and compressed parameter data stored in a nonvolatile memory. The DSP processor reads the expanded program data and the expanded parameter data into a program memory and the data memory of the DSP processor, respectively, and then, decodes compressed digital data or encodes expanded digital data.

8 Claims, 2 Drawing Sheets

ENCODING/DECODING DEVICE FOR COMPRESSING OR EXPANDING DIGITAL DATA

RELATED APPLICATIONS

This application is the U.S. National Phase under 35 U.S.C. § 371 of International Application No. PCT/JP2004/014985, filed on Oct. 4, 2004, which in turn claims the benefit of Japanese Application No. 2004-032946, filed on Feb. 10, 2004, the disclosures of which Applications are incorporated by reference herein.

TECHNICAL FIELD

The present invention relates to an encoding/decoding device for performing encoding for compressing digital data, especially video or audio, and performing decoding for expanding compressed digital data.

BACKGROUND ART

Recently, high quality digital video and high quality digital audio are provided through DVDs, digital TV sets, and the like. Digital video data and digital audio increase in data amount as the qualities thereof are increased, and therefore, such data is compressed once for storage and transmission thereof in general. An encoding system (hereinafter referred to as an encoder) performs compression of digital data while a decoding system (hereinafter referred to as a decoder) performs expansion thereof, wherein these systems are composed of dedicated semiconductor elements usually.

Novel digital compression techniques for increasing the quality of video or audio are devised and reduced to practice day after day. In order to reduce to practice such novel digital compression techniques, the encoder and the decoder must cope with the novel techniques.

The decoder and the encoder for digital video or digital audio are required to be developed within a extremely short period of time in many cases. While, modification of hardware of semiconductors needs rather long time compared with modification of software. Therefore, a DSP (Digital Signal Processor) is usually used as the decoder and the encoder so that novel compression/expansion techniques are provided through software. The software implemented in the DSP includes two kinds of digital bit rows of program data that the DSP executes and parameter data that the program data uses.

FIG. 1 is a block diagram showing a configuration of a conventional digital video or audio encoding/decoding device.

A DSP 100 reads out program data 110 from a nonvolatile memory 101 and stores it to a program memory 102 inside the DSP 100. Also, it reads out parameter data 111 from the nonvolatile memory 101 and stores it to a data memory 103 inside the DSP 100.

Thereafter, when the DSP 100 serves as a decoder, the DSP 100 reads compressed digital data 112 into the data memory 103, decodes it, and then, outputs expanded digital data 113 to the outside. On the other hand, when the DSP 100 serves as an encoder, the DSP 100 reads the expanded digital data 113 into the data memory 103, encodes it, and then, outputs compressed digital data 112 to the outside (see Japanese Patent Application Laid Open Publication No. 5-110448A).

DISCLOSURE OF THE INVENTION

In association with a recent development of digital compression technology, compression techniques that the encoder and the decoder should support increase. Further, as can be seen in recent multifunctional chips called one-chip solution, the number of semiconductor elements incorporated in a single product is decreasing, resulting in a widened technical range that the encoder and the decoder in a single DSP should support.

Moreover, in digital video and audio technologies, an increase in compression rates accompanies a tendency to require a large amount of parameter data.

As a result of the foregoing, the program memory and the parameter memory in the DSP processor are required to have explosively large capacities.

Software for the DSP processor is usually stored in a rewritable nonvolatile memory such as a flash memory, rather than a ROM (Read Only Memory), so that data can be readily modified upon a problem rise thereafter. However, the flash memory is very expensive, and an increase in capacity thereof accompanies an increase in cost of a system as a whole, such as a DVD player.

The present invention has been made in view of the foregoing and has its object of providing a technique for reducing the capacity of a nonvolatile memory which a DSP processor needs.

In order to attain the above object, the present invention provides means for reducing a data amount by compressing data to be stored in a nonvolatile memory such as a flash memory, thereby preventing capacity shortage of the nonvolatile memory is prevented. Wherein, a general-purpose processor, rather than the DSP processor, is used for expanding compressed program data and compressed parameter data stored in the nonvolatile memory. In general, the general-purpose processor is incorporated as a system controller in a system such as a DVD player, and accordingly, this processor is utilized. Since the general-purpose processor has low performance in general, means for shortening time required for expanding compressed data is provided also.

Specifically, the present invention provides an encoding/decoding device for compressing or expanding digital data, which includes: a DSP processor for compressing or expanding the digital data; a nonvolatile memory in which compressed program data and compressed parameter data are stored; a volatile memory for temporarily storing the program data and the parameter data; and a general-purpose processor for controlling a system, wherein the general-purpose processor expands the compressed program data and the compressed parameter data and transmits them to the volatile memory, and the DSP processor reads the expanded program data and the expanded parameter data into an internal memory of the DSP processor and compresses or expands the digital data on the basis of the program data and the parameter data.

According to this invention, the general-purpose processor for system control, rather than the DSP processor, expands the compressed program data and the compressed parameter data, thereby eliminating the need for surplus processing capability of the DSP processor.

In the encoding/decoding device of the present invention, it is possible that the program data and the parameter data stored in the nonvolatile memory are each divided and compressed, and the general-purpose processor includes: means for separately reading the divided program data and the divided parameter data; and means for changing parts or all of the program data and the parameter data even when the DSP processor executes an encoding or decoding program data.

According to this invention, only parts of the compressed program data and the compressed parameter data in the nonvolatile memory are expanded and transmitted to the volatile memory, rather than expansion thereof in a unit of one decoder or one encoder, preventing an increase in system scale.

In the present invention, the DSP processor may have no means for expanding the compressed program data and the compressed parameter data.

According to this invention, there is no need of adding a program expansion function to the DSP processor, and therefore, the DSP processor is applicable to the architecture of the present invention with no modification of an encoding LSI or a decoding LSI inside the DSP processor necessitated.

In the present invention, the program data stored in the nonvolatile memory may include: compressed program data to be used in the DSP processor; and uncompressed program data to be used in the general-purpose processor.

According to this invention, the program data to be used in the general-purpose processor is stored in the nonvolatile memory without being compressed so that the general-purpose processor executes the program data as it is while the compressed program data and the compressed parameter data for the DSP processor, which are also stored in the nonvolatile processor separately, are expanded, thereby shortening the time required for activation of the system.

In the present invention, the program data and the parameter data may be divided in a unit that invites no impairment of real time performance based on internal processing of encoding or decoding in the DSP processor.

The above invention shortens wait time of the DSP processor stopping its operation until the program data and the parameter data to be used next are prepared when the DSP processor changes reading of the program data and the parameter data. This guarantees real time performance of the encoder and the decoder, which is an important characteristic that they should bear.

In the present invention, the program data and the parameter data may be divided in a unit within a capacity of the volatile memory and a capacity of the internal memory of the DSP processor.

According to this invention, the program data and the parameter data before compression are so designed to be divided so as not to be larger than the capacities of the memory incorporated in the DSP processor and the volatile memory, reducing the memory capacities thereof.

In the present invention, the program data and the parameter data may be divided in a unit that enables real-time expansion within a processing capability of the general-purpose processor.

According to this invention, the program data and the parameter data are divided in the unit that the general-purpose processor, which has low performance though, can perform expansion of the compressed program data and the compressed parameter data without impairing the real time performance of the DSP processor. Therefore, additional processing capability is not needed in expansion by the general-purpose processor for system control.

In the present invention, the general-purpose processor may include means for notifying, after expansion of the compressed program data and the compressed parameter data upon receipt of a request for expansion of the compressed program data and the compressed parameter data from the DSP processor, expansion completion to the DSP processor, while the DSP processor may include means for reading, upon receipt of expansion completion information from the general-purpose processor, the expanded program data and the expanded parameter data into the internal memory of the DSP processor.

According to this invention, the DSP processor specifies a timing of changing the program data and the parameter data of the DSP processor, and the general-purpose processor performs expansion upon receipt of a request from the DSP processor. This prevents influence of division of the program data and the parameter data for the DSP processor on the program data of the general-purpose processor.

In the present invention, it is possible that the compressed program data and the compressed parameter data are each divided, each divided program data and each divided parameter data holding program data to be executed next and information on necessary parameter data, respectively and both program data for the general-purpose processor and program data for the DSP processor have a same compressed data management table for specifying the program data and the parameter data.

According to this invention, both the programs have the same table, and the program data and the parameter data are specified using the table numbers, so that an amount of communication from the DSP processor to the general-purpose processor can be reduced, simplifying the processing for notifying to the general-purpose processor program data and parameter data necessary for the DSP processor next.

In the present invention, the general-purpose processor may include: means for expanding program data and parameter data different from those in a request from the DSP processor and transmitting them to the volatile memory while ignoring the request; and means for controlling an operation of the DSP processor from the general-purpose processor regardless of the operation of the DSP processor.

According to this invention, a request for expanding the program data and the parameter data that the DSP processor issues to the general-purpose processor is ignored, and another piece of program data and another piece of parameter data are expanded and transmitted to the DSP processor, chancing the operation of the DSP processor.

In the present invention, it is possible that the general-purpose processor further includes means for issuing an instruction for compelling the DSP processor to change reading of the program data and the parameter data into the DSP processor and the DSP processor includes means for reading the expanded program data and the expanded parameter in the volatile memory into the internal memory while stopping an encoding or decoding operation upon receipt of the instruction.

According to this invention, reading of the program data and the parameter data is instructed from the general-purpose processor to the DSP processor at a timing other than the timing when a request for expanding the program data and the parameter data is issued from the DSP processor to the general-purpose processors thereby changing the operation of the DSP processor to increase the number of timings that the general-purpose processor can control the operation of the DSP processor.

According to the present invention, the capacities of the nonvolatile memory and the volatile memory can be reduced without inviting specification change and a remarkable cost increase of the DSP processor, and the capacity of the memory incorporated in the DSP processor can be also reduced, achieving cost reduction of the system as a whole.

BEST MODE FOR CARRYING OUT THE INVENTION

An embodiment of the present invention will be described below in detail with reference to the drawings. The following description of the preferred embodiment is substantially a mere example and is not intended to limit the present invention, applicable objects thereof, and use thereof.

Figure 1:
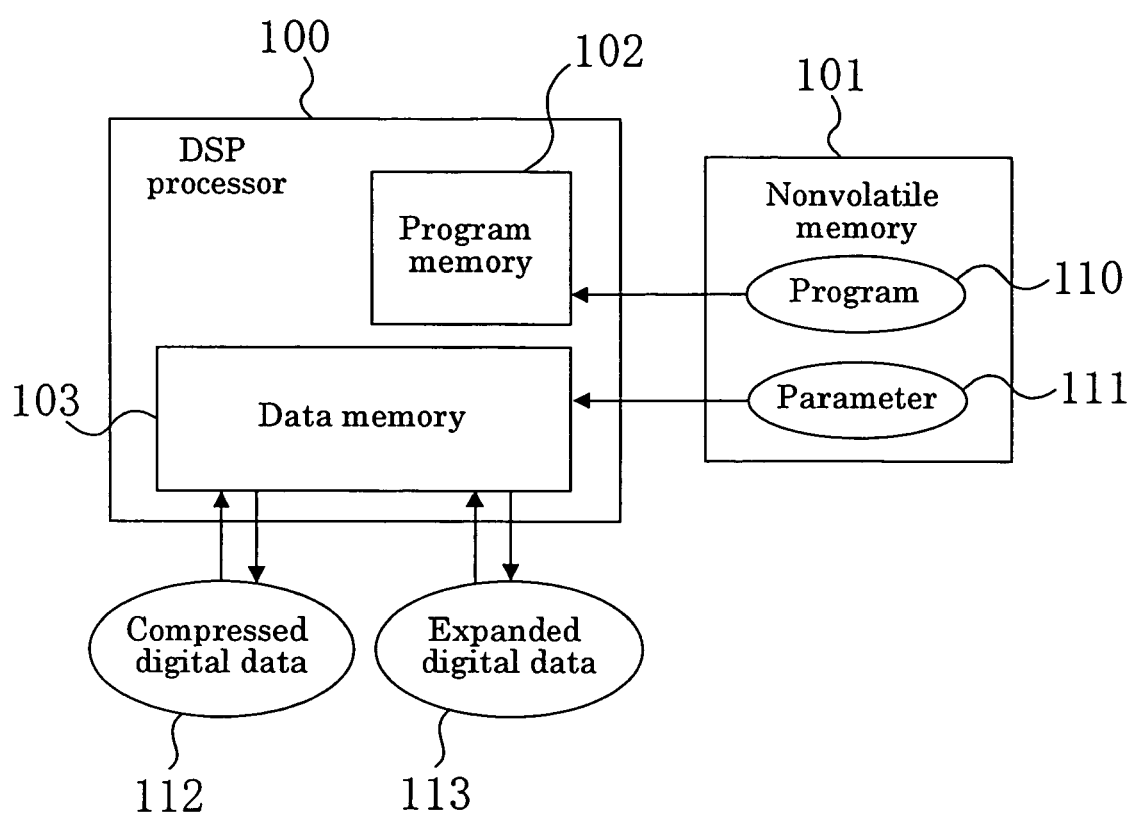
FIG. 1 is a block diagram showing a configuration of a conventional encoding/decoding device.
Figure 2:
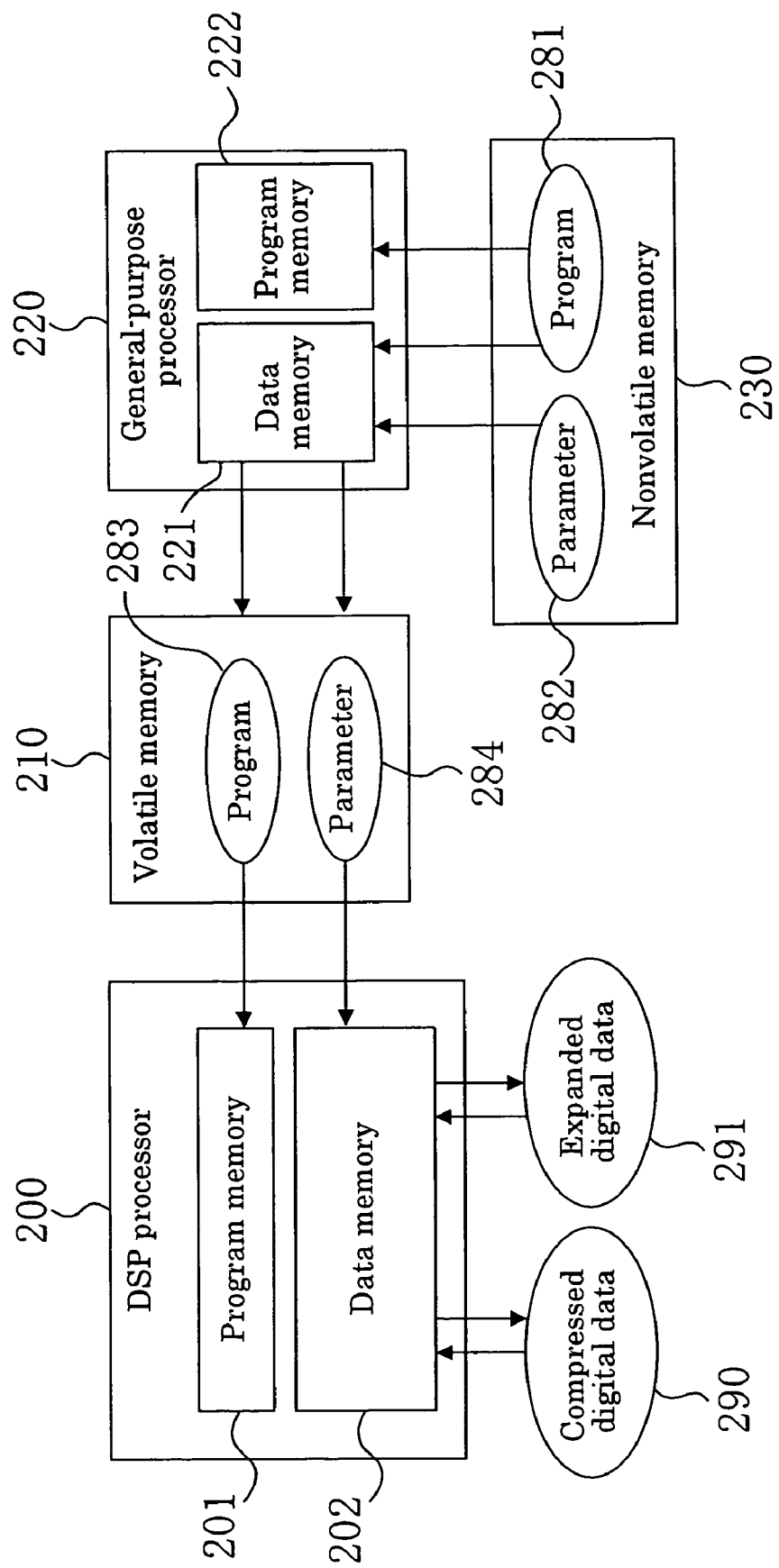
FIG. 2 is a block diagram showing a configuration of an encoding/decoding device according to an embodiment of the present invention.

In FIG. 2, a DSP processor 200 performs compression or expansion of digital data such as digital video, digital audio, or the like, and includes a program memory 201 for storing program data 283 which is stored in a volatile memory 210 and which is to be executed by the DSP processor 200 and a data memory 202 for storing parameter data 284 to be used for the program data. Further, the DSP processor 200 includes a codec LSI (not shown) for compression or expansion of the digital data.

Program data 281 and parameter data 282 subjected to reversible compression and stored in a nonvolatile memory 230 are expanded in a general-purpose processor 220 so as to be utilized as they are as the program data 283 and the parameter data 284 in the DSP processor 200. Wherein, the program data 281 stored in the nonvolatile memory 230 includes uncompressed program data generated for the general-purpose processor 220.

The general-purpose processor 220 controls a system as a whole including an encoding/decoding device according to the present invention and includes a data memory 221 for storing the compressed program data 281 and the compressed parameter data 282 and a program memory 222 for storing the uncompressed program data for the general-purpose processor 220.

The encoding/decoding device as a whole will be described below in detail in sequence of an operation for decoding compressed digital data 290.

First, the general-purpose processor 220 reads only the uncompressed program data to be used in the general-purpose processor 220 into the program memory 222 from the program data 281 stored in the nonvolatile memory 230.

Next, the general-purpose processor 220 reads the compressed program data 281 and the compressed parameter data 282 which are to be used in the DSP processor 200 to the data memory 221, expands them, with the use of the program data previously stored in the program memory 222, as the program data 283 and the parameter data 284 which are necessary for activating the DSP processor 200, and transmits them to the nonvolatile memory 210.

Wherein, only data necessary for activating the DSP processor 200 is expanded as the expanded program data 283 and the expanded parameter data 284, rather than expansion of all of the compressed program data 281 and the compressed parameter data 282 stored in the data memory 221. This is done for minimizing the time required for the activation by eliminating the need for expanding all the data. It is noted that the compressed program data 281 and the compressed parameter data 282 are divided for storage with real time performance of a decoder, memory capacity, and processing capability of the general-purpose processor 220 taken into consideration.

The DSP processor 200 reads the program data 283 and the parameter data 284 into the program memory 201 and the data memory 202, respectively.

Subsequently, compressed digital video or audio data 290 is input to the DSP processor 200. The DSP processor 200 judges the compression type of the input digital data 290 and notifies to the general-purpose processor 220 the program data 283 and the parameter data 284 which are necessary for decoding the compressed digital data 290. This operation is performed by notifying only a table number in a compressed data management table that the DSP processor 200 and the general-purpose processor 220 share.

Upon receipt of the request from the DSP processor 200, the general-purpose processor 220 expands necessary data from the compressed program data 281 and the compressed parameter data 282 stored in the nonvolatile memory 230 and transmits them to the volatile memory 210. The genera-purpose processor 220 notifies to the DSP processor 200 completion of expansion of the requested data. Upon receipt of the notification, the DSP processor 200 reads the expanded program data 283 and the expanded parameter data 284 into internal memories thereof, that is, the program memory 201 and the data memory 202, respectively.

Herein, only data necessary for decoding the compressed digital data 290 is expanded as the expanded program data 283 and the expanded parameter data 284, as well. The compressed program data 281 and the compressed parameter data 282 are each divided with the real time performance of the decoder, the memory capacity, and the processing capability of the general-purpose processor 220 taken into consideration, involving no problems such as impairment of real time performance, insufficient processing capability of the general-purpose processor, and the like.

The above operations are repeated, namely, the following operations are repeated: the DSP processor 200 requests the general-purpose processor 220 to transmit data according to needs; the general-purpose processor 220 expands partially the compressed program data 281 and the compressed parameter data 282 stored in the nonvolatile memory 230 and stores the expanded program data 283 and the expanded parameter data 284 into the volatile memory 210; the DSP processor 200 receives a notification indicating preparation completion from the general-purpose processor 220, stores the data into the program memory 201 and the data memory 202, and expands the compressed digital data 290. The employment of this method eliminates the need of storing all the data of one piece of expanded program data 283 and one piece of parameter data 284 therefor into the program memory 201 and the data memory 202, respectively, of the DSP processor 200, resulting in reduction in memory capacities.

The system such as a DVD player must be controlled as a whole in some cases such as a case of a reset request of the system, a case of change in compression type of input compressed digital video or audio data 290, and the like. In such a case, the general-purpose processor 220 serving as a system controller must control the operation of the DSP processor 200. In this case, the general-purpose processor 220 ignores the request from the DSP processor 200 and stores program data and parameter data different from the expanded program data 283 and the expanded parameter data 284 into the volatile memory 210 for controlling the operation of the DSP processor 200. In this method, the operation of the DSP processor 200 is changed at the time when the DSP processor 200 reads the program data 283 and the parameter data 284 in the volatile memory 210. Accordingly, if the operation of the DSP processor 200 must be changed at a further earlier timing, means for issuing an instruction for compelling the DSP processor 200 to read the program data 283 and the parameter data 284 in the volatile memory 210 is provided in the general-purpose processor 220.

Hence, the above method attains capacity reduction of the volatile memory 210 and the nonvolatile memory 230 for the decoder, capacity reduction of the internal memories of the DSP processor 200, and lowering of request performance of the general-purpose processor 220. Further, time loss in processing can be minimized in the DSP processor 200.

The system for the encoder will be described next. First, the general-purpose processor 220 reads only the uncompressed program data to be used in the general-purpose processor 220 into the program memory 222 from the program data 281 stored in the nonvolatile memory 230.

Next, the general-purpose processor 220 reads the compressed program data 281 and the compressed parameter data 282 which are to be used in the DSP processor 200 into the data memory 221, expands the program data 283 and the parameter data 284 necessary for activating the DSP processor 200 with the use of the program data previously stored in the program memory 222, and transmits them to the volatile memory 210.

Similarly to that in the decoder, not all of the compressed program data 281 and the compressed parameter data 282 are expanded as the expanded program data 283 and the expanded parameter data 284.

Then, the DSP processor 200 reads the program data 283 and the parameter data 284 into the program memory 201 and the data memory 202, respectively.

Subsequently, uncompressed, expanded video or audio digital data 291 is input into the DSP processor 200. The DSP processor 200 notifies to the general-purpose processor 220 the program data 283 and the parameter data 284 necessary for compressing the expanded digital data 291 to the compression type that the user specifies. Upon receipt of the request from the DSP processor 200, the general-purpose processor 220 reads and expands the necessary data from the compressed program data 281 and the compressed parameter data 282 stored in the nonvolatile memory 230 and transmits them to the volatile memory 210. The general-purpose memory 220 notifies the expansion completion of the requested data to the DSP processor 200. Upon receipt of the notification, the DSP processor 200 reads the expanded program data 283 and the expanded parameter data 284 into the internal memories thereof, that is, the program memory 201 and the data memory 202, respectively.

Herein, only the data necessary for encoding the expanded digital data 291 is expanded as the expanded program data 283 and the expanded parameter data 284, as well as in the case of the above decoder.

The above described operations are repeated, namely, the following operations are repeated: the DSP processor 200 requests the general-purpose processor 220 to transmit data according to needs; the general-purpose processor 220 expands partially the compressed program data 281 and the compressed parameter data 282 stored in the nonvolatile memory 230 and stores the expanded program data 283 and the expanded parameter data 284 into the volatile memory 210; the DSP processor 200 receives a notification indicating preparation completion from the general-purpose processor 220, stores the data into the program memory 201 and the data memory 202, and compresses the expanded digital data 291.

In order to coping with a reset operation of the system and the like, means for controlling the operation of the DSP processor 200 is provided in the encoder of the general-purpose processor 220, as well as in the decoder.

INDUSTRIAL APPLICABILITY

As described above, the present invention attains reduction in capacities of the nonvolatile memory and the volatile memory, and in addition, of the internal memories of the DSP processor with no remarkable cost increase and no impairment of real time performance of the decoder and the encoder invited. Thus, the system cost can be reduced.

The invention claimed is:

1. An encoding/decoding device for compressing or expanding digital data, comprising:
   a DSP processor for compressing or expanding the digital data;
   a nonvolatile memory in which compressed program data and compressed parameter data are stored;
   a volatile memory for temporarily storing the program data and the parameter data; and
   a general-purpose processor for controlling a system,
   wherein the general-purpose processor expands the compressed program data and the compressed parameter data and transmits them to the volatile memory,
   the DSP processor reads the expanded program data and the expanded parameter data into an internal memory of the DSP processor and compresses or expands the digital data on the basis of the program data and the parameter data,
   the program data and the parameter data stored in the nonvolatile memory are each divided and compressed, and
   the general-purpose processor includes:
   means for separately reading the divided program data and the divided parameter data; and
   means for changing parts or all of the program data and the parameter data even when the DSP processor executes an encoding or decoding program data.

2. The encoding/decoding device of claim 1,
   wherein the program data and the parameter data are divided in a unit that invites no impairment of real time performance based on internal processing of encoding or decoding in the DSP processor.

3. The encoding/decoding device of claim 1,
   wherein the program data and the parameter data are divided in a unit within a capacity of the volatile memory and a capacity of the internal memory of the DSP processor.

4. The encoding/decoding device of claim 1,
   wherein the program data and the parameter data are divided in a unit that enables real-time expansion within a processing capability of the general-purpose processor.

5. The encoding/decoding device of claim 1,
   wherein the general-purpose processor includes means for notifying, after expansion of the compressed program data and the compressed parameter data upon receipt of a request for expansion of the compressed program data and the compressed parameter data from the DSP processor, expansion completion to the DSP processor, and
   the DSP processor includes means for reading, upon receipt of expansion completion information from the general-purpose processor, the expanded program data and the expanded parameter data into the internal memory of the DSP processor.

6. The encoding/decoding device of claim 1,
   wherein the compressed program data and the compressed parameter data are each divided, each divided program data and each divided parameter data holding program data to be executed next and information on necessary parameter data, respectively, and both program data for the general-purpose processor and program data for the DSP processor have a same compressed data management table for specifying the program data and the parameter data.

7. The encoding/decoding device of claim 5, wherein the general-purpose processor includes:
   means for expanding program data and parameter data different from those in a request from the DSP processor and transmitting them to the volatile memory while ignoring the request; and
   means for controlling an operation of the DSP processor from the general-purpose processor regardless of the operation of the DSP processor.

8. The encoding/decoding device of claim 7, wherein the general-purpose processor further includes means for issuing an instruction for compelling the DSP processor to change reading of the program data and the parameter data into the DSP processor, and the DSP processor includes means for reading the expanded program data and the expanded parameter in the volatile memory into the internal memory while stopping an encoding or decoding operation upon receipt of the instruction.

* * * * *